(12) United States Patent
Lu et al.

(10) Patent No.: US 11,482,689 B2
(45) Date of Patent: Oct. 25, 2022

(54) PACKAGING METHOD, ELECTRONIC DEVICE, AND PACKAGING APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Mengmeng Lu, Beijing (CN); Sha Feng, Beijing (CN); Bo Zhou, Beijing (CN); Yongzhi Song, Beijing (CN)

(73) Assignees: BEIJING BOE DISPLAY TECHNOLOGY CO., LTD., Beijing (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 589 days.

(21) Appl. No.: 16/475,429

(22) PCT Filed: Dec. 6, 2018

(86) PCT No.: PCT/CN2018/119561
§ 371 (c)(1),
(2) Date: Jul. 2, 2019

(87) PCT Pub. No.: WO2019/196444
PCT Pub. Date: Oct. 17, 2019

(65) Prior Publication Data
US 2021/0367182 A1    Nov. 25, 2021

(30) Foreign Application Priority Data

Apr. 11, 2018 (CN) .......................... 201810321828.5

(51) Int. Cl.
*H01L 29/08* (2006.01)
*H01L 51/52* (2006.01)
*H01L 51/56* (2006.01)

(52) U.S. Cl.
CPC ............ *H01L 51/524* (2013.01); *H01L 51/56* (2013.01)

(58) Field of Classification Search
CPC ....... H01L 51/52; H01L 51/56; H01L 51/524; H01L 51/5253; H01L 51/5237;
(Continued)

(56) References Cited

U.S. PATENT DOCUMENTS

| 10,033,011 B1 | 7/2018 | Chen et al. |
| 2013/0188239 A1 | 7/2013 | O'Keeffe |
| 2014/0307039 A1* | 10/2014 | Tamoto ............... G02F 1/16755 347/221 |

FOREIGN PATENT DOCUMENTS

| CN | 102253502 A | 11/2011 |
| CN | 103091926 A | 5/2013 |

(Continued)

*Primary Examiner* — Chuong A Luu
(74) *Attorney, Agent, or Firm* — Leason Ellis LLP

(57) ABSTRACT

Embodiments of the present disclosure provide a packaging method, an electronic device, and a packaging apparatus. The packaging method includes: providing a first substrate and a second substrate; and cell-assembling the first substrate and the second substrate to sandwich a filling glue between the first substrate and the second substrate to form a packaging structure, the filling glue is mixed with electrophoretic liquid encapsulated by a capsule, and the electrophoretic liquid includes an electrophoretic particle; in a process of cell-assembling the first substrate and the second substrate, applying an electric field to control the electrophoretic particle to move directionally to deform the capsule.

19 Claims, 3 Drawing Sheets

(58) Field of Classification Search
CPC ..... H01L 27/32; H01L 27/3211; H01L 23/16; H01L 23/26; H01L 23/3142; H01L 23/3157; H01L 23/295; H01L 23/296
USPC ......................................................... 257/40
See application file for complete search history.

(56) References Cited

FOREIGN PATENT DOCUMENTS

| | | | |
|---|---|---|---|
| CN | 105607333 | A | 5/2016 |
| CN | 105957977 | A | 9/2016 |
| CN | 106784360 | A | 5/2017 |
| CN | 108470846 | A | 8/2018 |

* cited by examiner

PACKAGING METHOD, ELECTRONIC DEVICE, AND PACKAGING APPARATUS

CROSS REFERENCE TO RELATED APPLICATIONS

The present application is a U.S. National Stage Application under 35 U.S.C. § 371 of International Patent Application No. PCT/CN2018/119561, filed Dec. 6, 2018, which claims priority to Chinese Patent application No. 201810321828.5 filed on Apr. 11, 2018, both of which are incorporated by reference in their entireties as part of the present application.

TECHNICAL FIELD

Embodiments of the present disclosure relate to a packaging method, an electronic device, and a packaging apparatus.

BACKGROUND

Organic Light-Emitting Diode (OLED) has been widely used in the field of display technology for its excellent characteristics such as self-luminescence, no need of backlight, high contrast, small thickness, wide viewing angle, low power consumption, fast response speed, applicability in flexible panel, wide application temperature range, simple structure, and simple manufacturing process, etc. However, water vapor and oxygen may corrode an OLED display device and affect its service life. Therefore, the OLED display device needs to be strictly packaged for protection.

Sealant is a key material in a cell-assembling process of an organic light-emitting diode. Different positions at which the sealant is applied have different effects. For a large-sized OLED, a dam-fill packaging method is commonly used, which includes: utilizing a glue with relatively high viscosity to form a cofferdam, forming a filling glue with relatively low viscosity in a closed region formed by the cofferdam, diffusing the filling glue upon an upper substrate and a lower substrate being pressed and cell-assembled so that the filing glue fills an internal space of the cofferdam, and finally curing the filling glue to accomplish a packaging process.

SUMMARY

At least one embodiment of the present disclosure provides a packaging method, including: providing a first substrate and a second substrate; and cell-assembling the first substrate and the second substrate to sandwich a filling glue between the first substrate and the second substrate to form a packaging structure, the filling glue is mixed with electrophoretic liquid encapsulated by a capsule, and the electrophoretic liquid includes an electrophoretic particle; in a process of cell-assembling the first substrate and the second substrate, applying an electric field to control the electrophoretic particle to move directionally to deform the capsule.

For example, in the packaging method provided by at least one embodiment of the present disclosure, the electrophoretic liquid is electrophoretic suspension liquid or an electrophoretic colloid solution.

For example, in the packaging method provided by at least one embodiment of the present disclosure, the electrophoretic particle includes one selected from the group consisting of a positively charged inorganic particle, a positively charged organic particle, a negatively charged inorganic particle, and a negatively charged organic particle.

For example, in the packaging method provided by at least one embodiment of the present disclosure, the electrophoretic liquid further includes a dispersion medium, a charge control agent and a stabilizer.

For example, in the packaging method provided by at least one embodiment of the present disclosure, a material of the dispersion medium includes at least one selected from the group consisting of octane, heptane, toluene, ethylbenzene, o-xylene, n-butanol, carbon tetrachloride, tetrachloroethylene, styrene, (methyl) methacrylate, ethyl methacrylate, butyl methacrylate, divinylbenzene, diethylene glycol diacrylate, butylene glycol diacrylate, 1,6-hexanediol diacrylate, dipropylene glycol diacrylate, tripropylene glycol diacrylate, trimethylolpropane triacrylate, pentaerythritol tetraacrylate, dipentaerythritol pentaacrylate, and dipentaerythritol hexaacrylate.

For example, in the packaging method provided by at least one embodiment of the present disclosure, the charge control agent includes at least one selected from the group consisting of organic sulfate, organic amide, and organic phosphate.

For example, in the packaging method provided by at least one embodiment of the present disclosure, the stabilizer includes at least one selected from the group consisting of polyoxyethylene, alkyl dimethylamine oxide, sodium dodecyl benzene sulfonate, and propyl trimethoxy hydrochloride.

For example, in the packaging method provided by at least one embodiment of the present disclosure, a material of the capsule includes at least one selected from the group consisting of urea formaldehyde resin, polyaniline, and melamine resin.

For example, the packaging method provided by at least one embodiment of the present disclosure further includes: forming a closed cofferdam glue on the first substrate; and applying the filling glue in a filling region formed by the cofferdam glue.

For example, the packaging method provided by at least one embodiment of the present disclosure further includes: performing a curing treatment to the filling glue.

For example, in the packaging method provided by at least one embodiment of the present disclosure, performing a curing treatment to the filling glue includes: performing a heating treatment or an ultraviolet irradiation treatment to the filling glue.

For example, in the packaging method provided by at least one embodiment of the present disclosure, the process of cell-assembling the first substrate and the second substrate includes: providing a first pressing platform, and placing the first substrate on the first pressing platform; providing a second pressing platform, and fixing the second substrate on the second pressing platform, the first pressing platform and the second pressing platform being arranged opposite to each other; providing at least one electric field control element configured to apply the electric field to control the electrophoretic particle to move directionally to deform the capsule; and controlling the second pressing platform on which the second substrate is fixed to press downward toward the first pressing platform on which the first substrate is placed.

For example, in the packaging method provided by at least one embodiment of the present disclosure, the at least one electric field control element is located on a side of the first pressing platform on which the first substrate is not placed.

For example, in the packaging method provided by at least one embodiment of the present disclosure, the at least one electric field control element is located on a left side and/or a right side of the first substrate and the second substrate.

For example, in the packaging method provided by at least one embodiment of the present disclosure, a direction in which the electric field is applied is parallel to a plate surface of the first substrate and the second substrate.

At least one embodiment of the present disclosure provides an electronic device, including: a first substrate and a second substrate cell-assembled with each other; and a filling glue sandwiched between the first substrate and the second substrate, the filling glue is mixed with electrophoretic liquid encapsulated by a capsule, the electrophoretic liquid includes an electrophoretic particle, and the electrophoretic particle is movable directionally under an action of an electric field to deform the capsule.

For example, the electronic device provided by at least one embodiment of the present disclosure further includes: a closed cofferdam glue disposed on the first substrate, wherein the filling glue is disposed in a filling region formed by the cofferdam glue.

At least one embodiment of the present disclosure provides a packaging apparatus, including: a glue applying component, configured to form a filling glue on a first substrate or a second substrate, the filling glue being mixed with an electrophoretic liquid encapsulated by a capsule, and the electrophoretic liquid including an electrophoretic particle; a cell-assembling component configured to cell-assemble the first substrate and the second substrate; and an electric field control element configured to apply an electric field to control the electrophoretic particle to move directionally to deform the capsule in a cell-assembling process of the first substrate and the second substrate.

BRIEF DESCRIPTION OF THE DRAWINGS

In order to clearly illustrate the technical solutions of the embodiments of the present disclosure, the drawings of the embodiments will be briefly described in the following. Apparently, the described embodiments are just a part but not all of the embodiments of the present disclosure.

DETAILED DESCRIPTION

Figure 1:
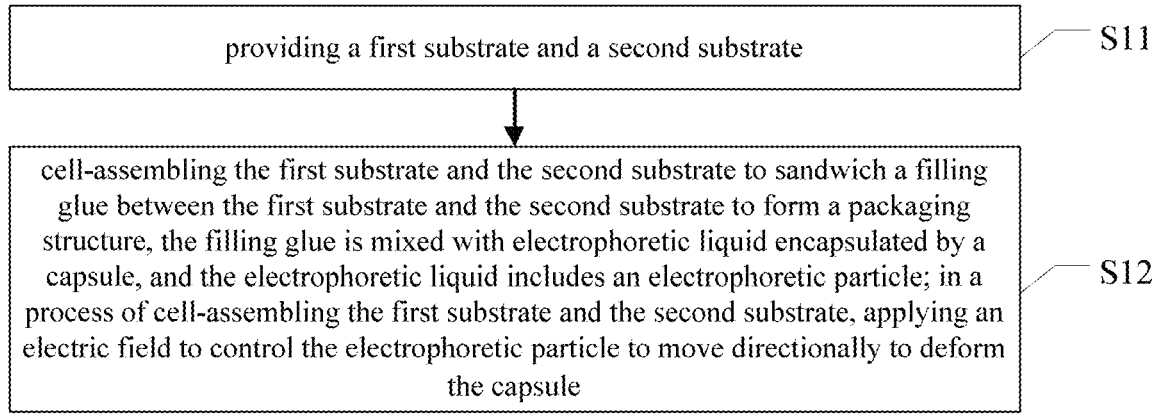
FIG. 1 is a flowchart of a packaging method provided by an embodiment of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At present, although OLED display device is usually packaged in a vacuum environment, a small amount of gas is still left in the filling glue and forms air bubbles in a process of pressing and cell-assembling two opposite substrates, and most of the air bubbles are concentrated in corners of cofferdam glue and are difficult to remove. It is easy for the residual air bubbles to cause a phenomenon that the filling glue is hung-up or even broken, which leads to an uneven distribution of the filling glue, thus directly affecting the display effect of the display device and reducing the product yield. Moreover, the air bubbles formed at the corners of the cofferdam glue have no isolation effect on water and oxygen and cannot prevent water and oxygen from entering the organic light-emitting element, thus affecting the packaging effect and reducing the service life of the product.

At least one embodiment of the present disclosure provides a packaging method. The packaging method includes: providing a first substrate and a second substrate; and cell-assembling the first substrate and the second substrate to sandwich a filling glue between the first substrate and the second substrate to form a packaging structure. The filling glue is mixed with an electrophoretic liquid encapsulated by a capsule, and the electrophoretic liquid includes an electrophoretic particle; in a process of cell-assembling the first substrate and the second substrate, applying an electric field to control the electrophoretic particle to move directionally to deform the capsule. In the process of deformation of the capsule, for example, in the process that the capsule changes from a spherical shape to an ellipsoidal shape, a certain squeezing effect will be generated on the filling glue surrounding the capsule. Due to the low viscosity of the filling glue, the filling glue will be urged to be uniformly diffused to all parts of the filling region, and air bubbles can be extruded from the inside of the filling glue, which improves the packaging effect. Besides, the packaging method is simple and has low costs.

For example, FIG. 1 is a flowchart of a packaging method provided by an embodiment of the present disclosure. The packaging method may be applicable to, for example, an organic light-emitting diode device (OLED), an OLED display device, and may also be applicable to other electronic devices, such as a liquid crystal display device, an electronic paper display device, and the like. As illustrated by FIG. 1, the packaging method includes the following steps.

S11: providing a first substrate and a second substrate.

For example, if needed, the first substrate and the second substrate can be cleaned by a standard method, and the first substrate and the second substrate can be glass substrates, quartz substrates, plastic substrates or ultra-thin metal substrates, etc., on which required components or circuits, etc. are formed. For example, the first substrate may be a package substrate (cover plate), a color film substrate, or the like; the second substrate may be an array substrate or the like on which a light-emitting element, a driving circuit or the like may be formed. For example, for a liquid crystal display device, a polarizer or the like may be respectively attached on one side of the first substrate and one side of the second substrate.

S12: cell-assembling the first substrate and the second substrate to sandwich a filling glue between the first substrate and the second substrate to form a packaging structure, the filling glue being mixed with an electrophoretic liquid encapsulated by a capsule, and the electrophoretic liquid including an electrophoretic particle; in a process of cell-assembling the first substrate and the second substrate, applying an electric field to control the electrophoretic particle to move directionally to deform the capsule.

For example, the filling glue may be an ultraviolet curable resin material or a thermal curable resin material.

For example, the filling glue may be one or a combination of plural ones selected from the group consisting of a melamine formaldehyde resin, unsaturated polyester resin, silicone resin, furan resin, and a homopolymer or copolymer of monomers such as epoxy resin, propylene oxide acrylate, propylene oxide methacrylate, methyl methacrylate, ethyl methacrylate, n-butyl methacrylate, 6,7-epoxyheptyl methacrylate, and 2-hydroxyethyl methacrylate.

For example, the capsule is neither soluble in the filling glue nor chemically reacts with the filling glue, and the capsule serves a role of isolating the electrophoretic liquid from the filling glue.

For example, the electrophoretic liquid is an electrophoretic suspension or an electrophoretic colloid solution; in the electrophoretic suspension, a size of solid particle may be greater than 100 nm, for example, in the range from 100 nm to 500 nm; and in colloidal solution, a size of solid particle is in the range from 1 nm to 100 nm.

For example, a viscosity of the filling glue at room temperature is in the range from 10 mPa·s to 100 mPa·s. Due to certain mass of the electrophoretic particle, the filling glue having a viscosity in this range can allow the capsule to be deformed due to the impact of the electrophoretic particle under the action of an electric field, and can also meet the viscosity required for packaging.

For example, the viscosity of the filling glue can be 10 mPa·s, 20 mPa·s, 30 mPa·s, 50 mPa·s, 70 mPa·s or 90 mPa·s.

For example, after the cell-assembling process, the filling glue may be subjected to a curing process, which may be a heat curing process or an ultraviolet irradiation curing process.

For example, in the case of heat curing process, a temperature of the heat curing process for curing the filling glue is 100 to 120° C., and a curing time is 100 to 120 minutes.

For example, in the case of performing an ultraviolet irradiation curing process to the filling glue, the time for the ultraviolet irradiation curing process is 5 minutes, and an irradiation intensity of the ultraviolet irradiation curing process is 360 to 500 W/m².

For example, a volume ratio of the capsule encapsulating the electrophoretic liquid in the filling glue is 0.5% to 10%, which can ensure the electrophoretic particle moves directionally to deform the capsule under the action of the electric field and accelerate the flow of the filling glue so as to extrude the air bubbles in the filling glue, without affecting the packaging effect and the viscosity of the filling glue.

For example, the electrophoretic particle includes one selected from the group consisting of a positively charged inorganic particle, a positively charged organic particle, a negatively charged inorganic particle, and a negatively charged organic particle.

For example, the inorganic particle includes one selected from the group consisting of titanium dioxide, aluminum oxide, chlorate, silicon oxide, chrome yellow, ultramarine, manganese violet, iron blue, cobalt blue, iron red and cadmium red. The organic particle includes one selected from the group consisting of pigment scarlet, toluidine red, phthalocyanine blue, phthalocyanine green and quinacridone.

For example, the above inorganic particle or organic particle can be positively or negatively charged by a surface modification treatment, and the surface modification treatment can adopt a method in related fields, which will not be described in details here.

Hereinafter, the case where the electrophoretic particle is titanium dioxide will be described by way of example, without limiting the embodiments of the present disclosure thereto.

1. Preparation of Titanium Dioxide Nano-Particles (1) Preparing titanium dioxide nano-particles by using a sol-gel method; the reagents as used are n-tetrabutyl titanate (analytically pure), anhydrous ethanol (analytically pure), glacial acetic acid (analytically pure), hydrochloric acid (analytically pure) and distilled water; the instruments as used include: a thermostatic magnetic stirrer, a stirrer, a three-port bottle (250 ml), a constant pressure funnel (50 ml), a measuring cylinder (10 ml, 50 ml) and a beaker (100 ml). The experimental steps are provided as follows: preparing a titanium dioxide sol with n-butyl titanate [Ti(OC$_4$H$_9$)$_4$] as a precursor, anhydrous ethanol (C$_2$H$_5$OH) as a solvent and glacial acetic acid (CH$_3$COOH) as a chelating agent; measuring 10 ml of butyl titanate at room temperature, slowly dropping the butyl titanate into 35 ml of absolute ethyl alcohol, and stirring intensely for 10 min with the thermostatic magnetic stirrer for mixing evenly to form a yellow clear solution A; adding 4 ml of glacial acetic acid and 10 ml of distilled water into another 35 ml of absolute ethyl alcohol, and stirring intensely to obtain a solution B; adjusting a pH value of the solution B to be pH≤3; slowly dropping the solution A having been moved into a separatory funnel into the solution B with intense stir at a dropping speed of about 3 ml/min, and heating in water bath at 30° C. to obtain a light yellow solution after finishing dropping; continuing stirring and heating in the water bath at 40° C. for 2 hours to obtain a white gel, and drying the white gel at 80° C. for about 20 hours; grinding the cured white gel into powders in a mortar, and calcining the powders at 400° C. for 2 hours.

(2) Modifying the surface of titanium dioxide by using polymethyl methacrylate (PMMA): dispersing 25 g of titanium dioxide prepared by the above method in 150 ml of water; adding 13.5 ml of methyl methacrylate and 1.5 ml of methacrylic acid; heating the system to 60° C. within about 20 minutes; adding 30 ml of 0.075 mol/ml sodium bisulfite aqueous solution after 15 minutes and reacting for 2 h (hours); heating to 70° C. within 10 minutes; adding 15 ml of sodium bisulfite aqueous solution to complete the reaction and keeping the temperature for 1 h (hour); taking out and washing with a large amount of water; drying at 80° C. for 4 h (hours); and taking out and grinding.

Or, modifying the surface of titanium dioxide by using polyvinyl alcohol: dispersing 100 mg of titanium dioxide prepared by the above method in water dissolved with 35 mg of polyvinyl alcohol; stirring for a certain time so that polyvinyl alcohol is adsorbed onto the surface of titanium dioxide; adding ethanol into the system; filtering the solution for several times after evenly mixing; and slowly adding tetrachloroethylene that is mutually soluble with ethanol into the system by the same method. Because the polyvinyl alcohol is not dissolvable in tetrachloroethylene, it will wrap the surface of titanium dioxide and slowly precipitates.

Or, Modifying the surface of titanium dioxide with stearic acid: dispersing 50 g of titanium dioxide in 200 ml of toluene solution of stearic acid at a weight percentage concentration of 3%; heating to 100° C. while stirring within 20 minutes; keeping at a constant temperature for one hour, then filtering while hot, and washing for at least three times with n-hexane; and finally drying in a blast drying oven at 50° C.

2. Preparation of Electrophoretic Base Solution

Weighting 0.1 g of surface-modified TiO2 and dispersing the surface-modified TiO2 in 5 ml of tetrachloroethylene; then adding 50 microliters of organic amide and 0.05 g of sodium dodecyl sulfate for ultrasonic treatment for 30 min (minutes) to obtain the electrophoresis liquid. For example, using tetrachloroethylene as the dispersion medium, using organic amide as the charge control agent, and using sodium dodecyl benzene sulfonate as the stabilizer.

3. Preparation of Capsule

The preparation of urea formaldehyde resin by in-situ polymerization method is described as an example: mixing urea with formaldehyde at a molar ratio of 1:1 to 1:2; adding a certain amount of triethanolamine to adjust the pH value to 8 to 9.5; forming a prepolymer (monohydroxymethyl urea and dimethylol urea) by reaction at 60 to 90° C.; adding the prepolymer into an aqueous solution of OP-10 emulsifier and stirring evenly; adding the above-described electrophoresis liquid; adjusting the pH value to 2.0 to 4.5 by a hydrochloric acid aqueous solution with a mass percentage content of 3%; reacting at 20-90° C. for a certain time; removing the reaction system by centrifugation; pouring out the supernatant liquid; and washing out the residual tetrachloroethylene by a solvent which is mutually soluble with tetrachloroethylene and water, such as ethanol, acetone, glacial acetic acid and the like, so as to separate the capsule.

Figure 2:
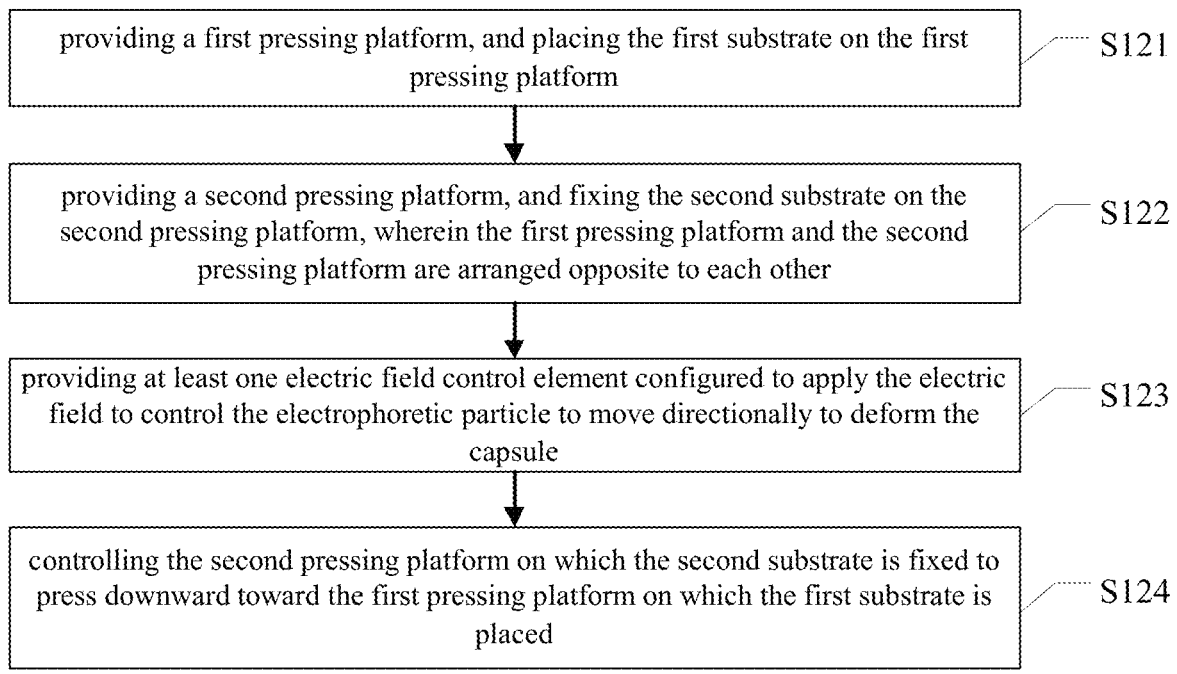
FIG. 2 is a flowchart of an assembling process provided by an embodiment of the present disclosure.
Figure 3:
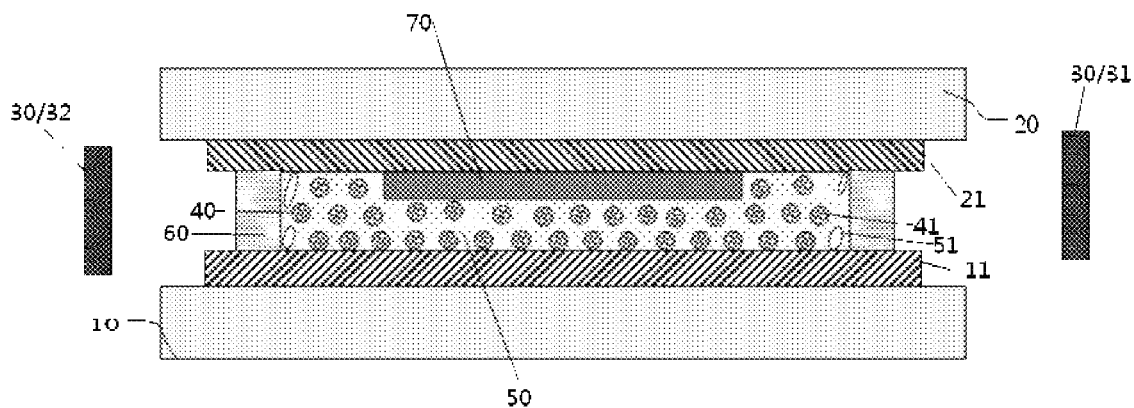
FIGS. 3-4 are schematic diagrams of an assembling process provided by an embodiment of the present disclosure.
Figure 4:
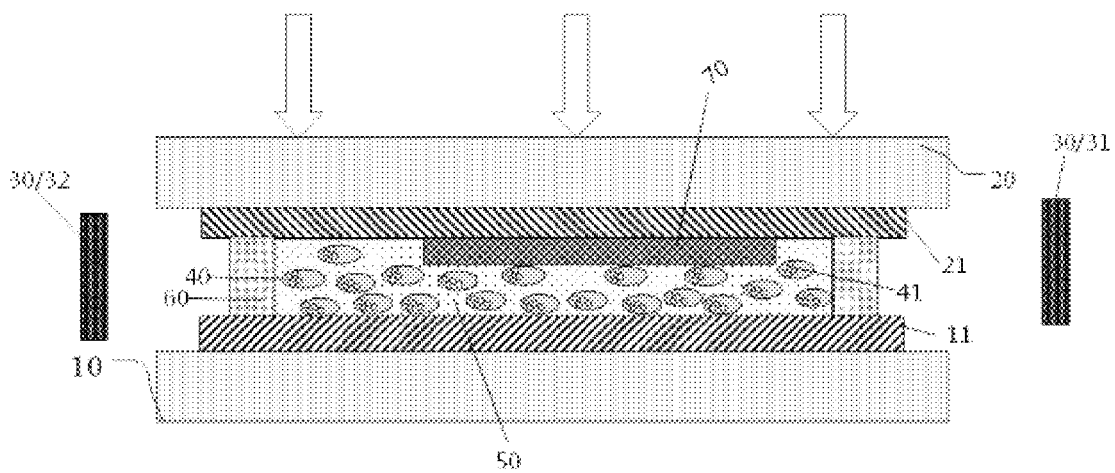

For example, FIG. 2 is a flowchart of an assembling process provided by an embodiment of the present disclosure, and FIGS. 3 and 4 are schematic diagrams of the assembling process provided by an embodiment of the present disclosure. With reference to FIGS. 2, 3 and 4, the assembling process includes the following steps.

S121: providing a first pressing platform 10, and placing the first substrate 11 on the first pressing platform 10.

S122: providing a second pressing platform 20, and fixing the second substrate 21 on the second pressing platform 20. The first pressing platform 10 and the second pressing platform 20 are arranged opposite to each other.

For example, the second substrate 21 may be fixed on the second pressing platform table 20 by vacuum adsorption, manipulator grasping, or the like.

S123: providing at least one electric field control element 30, which is configured to apply an electric field to control the electrophoretic particle 41 to move directionally to deform the capsule 40 during the assembling process.

For example, the electric field control element 30 may be disposed on a side of the first pressing platform 10 on which the first substrate 11 is not placed, or may be independently disposed on a left side and/or a right side of the first substrate 11 and the second substrate 21.

S124: controlling the second pressing platform 20, on which the second substrate 21, is fixed to press downward toward the first pressing platform 10 on which the first substrate 11 is placed; during the pressing process, the electric field control element 30 is configured to apply an electric field to the electrophoretic particle 41 to allow the electrophoretic particle 41 to move and impact the capsule 40, so as to deform the capsule 40 to further squeeze the filling glue, thereby extruding the air bubbles 51 in the filling glue 50.

For example, the electric field control element 30 applies the electric field to the electrophoretic particle 41 by controlling a voltage between a first electric field control electrode 31 and a second electric field control electrode 32. For example, the first electric field control electrode 31 and the second electric field control electrode 32 are various suitable structures such as plate electrodes; for example, the first electric field control electrode 31 and the second electric field control electrode 32 are respectively applied with a high voltage (e.g., a positive voltage) and a low voltage (e.g., a negative voltage), or are alternately applied with a high voltage and a low voltage.

For example, a direction in which the electric field is applied may be substantially parallel to a plate surface of the first substrate 11 or the second substrate 21. The embodiments of the present disclosure are not limited thereto. For example, the direction in which the electric field is applied may also be inclined with respect to the plate surface of the first substrate 11 or the second substrate 21. For example, a front surface of a cell formed by the first substrate 11 and the second substrate 21 (i.e., the plate surface of the first substrate 11 or the second substrate 21) is provided with at least one first electrode, and two lateral surfaces of the cell are provided with at least two second electrodes, such that the direction of the applied electrical filed is inclined with respect to the plate surface of the first substrate 11 or the second substrate 21.

For example, FIG. 4 is a schematic diagram illustrating that the electrophoretic particle impacts the capsule to deform the capsule. As illustrated by FIG. 4, under the action of an electric field force, the electrophoretic particle 41 moves directionally, and the capsule 40 changes from a spherical shape to an ellipsoidal shape. In this way, the capsule 40 will squeeze the filling glue 50 surrounding the capsule 40.

It should be noted that, the shapes of the capsule before and after deformation are not limited, as long as the capsule can be deformed to squeeze the filling glue surrounding the capsule; and the above-described case where the capsule changes from a spherical shape to an ellipsoidal shape is just an example.

As illustrated by FIG. 3, bubbles 51 are usually formed at an edge region of the filling glue 50. As illustrated by FIG. 4, the capsule deforms and squeezes the filling glue under the action of an electric field force, so as to apply pressure to the bubbles to extrude the bubbles from the filling glue and make the bubbles disappear.

Figure 5:
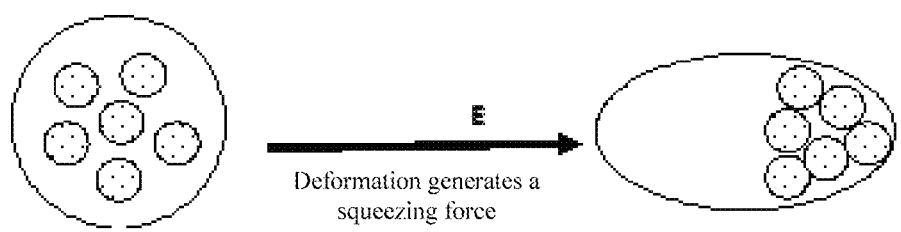
FIG. 5 is an enlarged schematic view illustrating a capsule deformation provided by an embodiment of the present disclosure.

For example, FIG. 5 is an enlarged schematic diagram illustrating capsule deformation provided by an embodiment of the present disclosure. The case where the electrophoretic particle is positively charged is described by way of example. Under the action of an electric field force, the positively charged electrophoretic particle moves along a direction of an electric field line. Correspondingly, when the electrophoretic particle is negatively charged, under the action of the electric field force, the negatively charged electrophoretic particle moves along a direction opposite to the direction of the electric field line. The electrophoretic particle has a certain mass, and the filling glue provided by the embodiment of the present disclosure has a relatively small viscosity, so the electrophoretic particle can deform the capsule.

It should be noted that, before the first substrate and the second substrate are cell-assembled, the packaging method further includes: forming closed cofferdam glue on the first substrate. As illustrated by FIG. 4, the closed cofferdam glue 60 includes a filling region in which the filling glue 50 is formed. For example, bubbles 51 in FIG. 3 are mostly formed around the cofferdam glue 60.

For example, a material of the cofferdam glue may be ultraviolet curable resin glue or thermal curable resin glue. For example, the material of the cofferdam glue may adopt at least one selected from the group consisting of a melamine formaldehyde resin, unsaturated polyester resin, silicone resin, furan resin, and a homopolymer or copolymer of monomers such as epoxy resin, propylene oxide acrylate, propylene oxide methacrylate, methyl methacrylate, ethyl methacrylate, n-butyl methacrylate, 6,7-epoxyheptyl methacrylate, and 2-hydroxyethyl methacrylate.

For example, a viscosity of the cofferdam glue is in the range of 10000-400000 mPa·s, and the viscosity of the cofferdam glue may be 10000 mPa·s, 150000 mPa·s, 200000 mPa·s, 300000 mPa·s or 400000 mPas.

For example, in the packaging method for OLED, before cell-assembling the first substrate and the second substrate, as illustrated by FIG. 4, forming an OLED element 70 and a driving circuit of the OLED element 70 on the second substrate 21.

At least one embodiment of the present disclosure also provides an electronic device, which is packaged by the packaging method described above. Examples of the electronic device include an organic light-emitting diode device (OLED display device), a liquid crystal display device, an electronic paper display device, and the like. The electronic device includes: a first substrate and a second substrate which are opposite to each other; and a filling glue located between the first substrate and the second substrate. The filling glue is mixed with electrophoresis liquid encapsulated by a capsule, the electrophoresis liquid includes an electrophoresis particle, and the electrophoresis particle can move directionally under the action of an electric field so as to deform the capsule.

Figure 6:
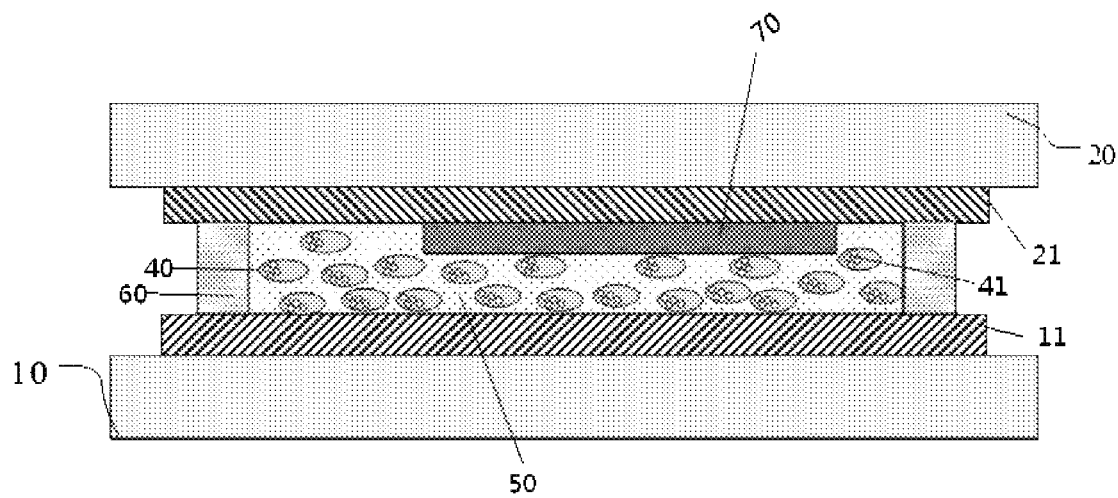
FIG. 6 is a schematic cross-sectional structural diagram of an organic light-emitting device provided by an embodiment of the present disclosure.

An organic light-emitting diode device will be described as an example in the following. For example, FIG. 6 is a schematic cross-sectional structure diagram of an organic light-emitting diode device provided by an embodiment of the present disclosure. As illustrated by FIG. 6, the organic light-emitting diode device includes: a first substrate 11 and a second substrate 21 which are opposite to each other; and a filling glue 50 located between the first substrate 11 and the second substrate 21; the filling glue 50 is mixed with electrophoretic liquid encapsulated by a capsule 40, the electrophoretic liquid includes an electrophoretic particle 41, and the electrophoretic particle 41 can move directionally under the action of an applied electric field to deform the capsule 40.

For example, the organic light-emitting diode device further includes a closed cofferdam glue 60 disposed on the first substrate 11, the filling glue 50 is disposed in a filling region formed by the cofferdam glue 60.

For example, in the organic light-emitting diode device provided in at least one embodiment of the present disclosure, the second substrate 21 is provided with an organic light-emitting diode element 70 and a driving circuit of the organic light-emitting diode element.

Figure 7:
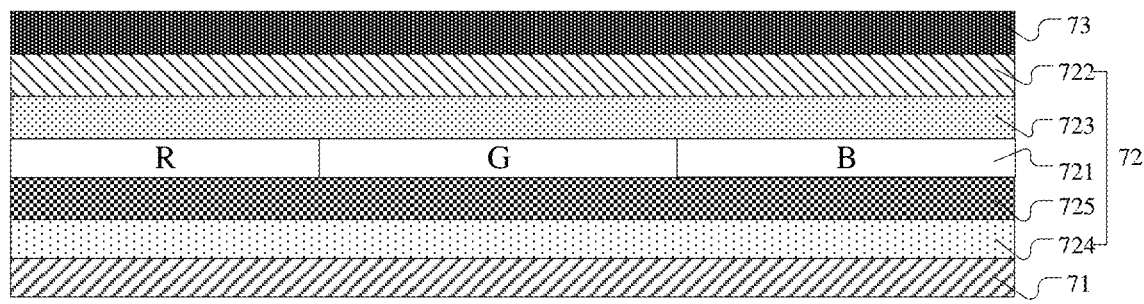
FIG. 7 is a schematic cross-sectional structural diagram of an organic light-emitting element provided by an embodiment of the present disclosure.

For example, FIG. 7 is a schematic cross-sectional structure diagram of an organic light-emitting element provided by an embodiment of the present disclosure. As illustrated by FIG. 7, the organic light-emitting diode element 70 includes a first electrode 71, an organic material functional layer 72, and a second electrode 73; the first electrode 71, the organic material functional layer 72, and the second electrode 73 are stacked. The organic material functional layer 72 may include a light-emitting layer 721, an electron injection layer 722, an electron transport layer 723, a hole injection layer 724, and a hole transport layer 725.

For example, as illustrated by FIG. 7, in order to effectively improve the light-emitting efficiency of the organic material functional layer 72 in the OLED device, the first electrode 71 may be used as an anode, and a hole transport layer 725 may be provided between the first electrode 71 and the light-emitting layer 721; the hole transport layer 725 may be formed by a solution process. The second electrode 73 is used as a cathode, and an electron transport layer 723 is provided between the second electrode 73 and the light-emitting layer 721. The electron transport layer 723 can be formed by a vacuum thermal evaporation process.

For example, a thickness of the hole transport layer 725 is 10 to 180 nm, and for example, the thickness of the hole transport layer 725 is 10 nm, 50 nm, 100 nm, 150 nm, or 180 nm.

For example, a material of the hole transport layer 725 includes polytriphenylamine, and the embodiments of the present disclosure are not limited thereto.

For example, a thickness of the electron transport layer 723 is 10 to 35 nm, and for example, the thickness of the electron transport layer 723 is 10 nm, 20 nm, 25 nm, 30 nm, or 35 nm.

For example, a material of the electron transport layer 723 is aluminum octahydroxyquinoline, and the embodiments of the present disclosure are not limited thereto.

For example, as illustrated by FIG. 7, the organic material functional layer 72 may further include an electron injection layer 722 disposed between the second electrode 73 and the electron transport layer 723; and a hole injection layer 724 disposed between the first electrode 71 and the hole transport layer 725.

For example, a thickness of the hole injection layer 724 is 10 to 180 nm, and for example, the thickness of the hole injection layer 724 is 10 nm, 50 nm, 100 nm, 150 nm, or 180 nm.

For example, a material of the hole injection layer 724 includes any one selected from the group consisting of poly (3,4-ethylenedioxythiophene)-polystyrene sulfonic acid (PEDOT/PSS), polythiophene, and polyaniline A material of the hole injection layer may also include any one selected from the group consisting of tri-[4-(5-phenyl-2-thienyl) benzene] amine, 4,4',4"-tri-[2-naphthyl(phenyl)amino] triphenylamine(2-TNATA), 4,4',4"-tri-(3-methylphenylamino)

triphenylamine (m-MTDATA), copper phthalocyanine (CuPc) and TPD. The embodiments of the present disclosure are not limited thereto.

For example, a thickness of the electron injection layer 722 is 1 to 5 nm, and for example, the thickness of the electron injection layer 722 is 1 nm, 2 nm, 4 nm, or 5 nm.

For example, a material of the electron injection layer 722 includes any one or a combination of plural ones selected from the group consisting of LiF and 8-hydroxyquinoline-lithium. The electron injection layer may also adopt an alkali metal oxide and other alkali metal fluoride. The alkali metal oxide includes lithium oxide ($Li_2O$), lithium oxide boron ($LiBO_2$), potassium silicon oxide ($K_2SiO_3$), cesium carbonate ($Cs_2CO_3$), etc. The alkali metal fluoride includes sodium fluoride (NaF) and the like. The embodiments of the present disclosure are not limited thereto.

It should be noted that, one of the first electrode 71 and the second electrode 73 is an anode, and the other one of the first electrode 71 and the second electrode 73 is a cathode. In addition to the embodiments in which the first electrode 71 is an anode and the second electrode 73 is a cathode, it's also possible that the first electrode 71 is a cathode and the second electrode 73 is an anode. Electrode material used as the anode includes a transparent conductive material such as indium tin oxide and zinc oxide. Electrode material used as the cathode includes aluminum, magnesium, or an alloy material of aluminum and magnesium. The embodiments of the present disclosure are not limited thereto.

Figure 8:
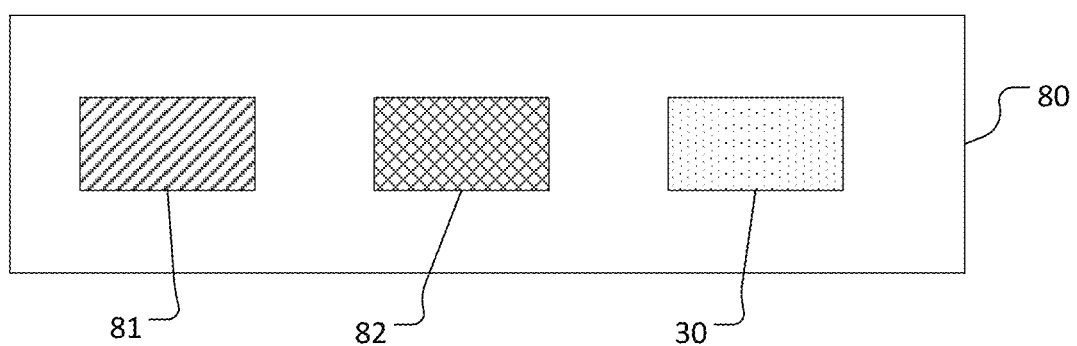
FIG. 8 is a schematic structural diagram of a packaging apparatus provided by an embodiment of the present disclosure.

At least one embodiment of the present disclosure also provides a packaging apparatus for implementing the above-described packaging method for an electronic device. For example, FIG. 8 is a schematic cross-sectional structural diagram of a packaging apparatus provided by an embodiment of the present disclosure. As illustrated by FIG. 8, the packaging apparatus 80 includes: a glue applying component 81 configured to form a filling glue on a first substrate or a second substrate, the filling glue is mixed with electrophoretic liquid encapsulated by a capsule, and the electrophoretic liquid includes an electrophoretic particle; a cell-assembling component 82 configured to cell-assemble the first substrate and the second substrate; and an electric field control element 30 configured to apply an electric field to control the electrophoretic particle to move directionally to deform the capsule during a cell-assembling process. For example, the glue applying component is also configured to form a closed cofferdam glue on the first substrate or the second substrate and form the filling glue in a filling region formed by the cofferdam glue.

For example, the glue applying component includes a nozzle, a glue taking channel, a pressurizing channel, etc. The glue taking channel is communicated with a glue storage container and is used for sucking filling glue to be coated onto the nozzle from the glue storage container and applying the filling glue onto the nozzle; the pressurizing passage is communicated with an air pump or an air storage tank and is used for guiding a high-pressure air to the nozzle, so that the air-sucked filling glue is extruded out of the nozzle for coating operation.

For example, the cell-assembling component includes a first pressing platform for placing the first substrate and a second pressing platform for fixing the second substrate.

The embodiments of the present disclosure provide a packaging method, an electronic device and a packaging apparatus which have at least one of the following beneficial effects:

(1) In the packaging method provided by at least one embodiment of the present disclosure, during the process of deformation of the capsule, a certain squeezing effect will be generated on the filling glue surrounding the capsule. Due to the low viscosity of the filling glue, the filling glue will be promoted to be uniformly diffused to all corners of the filling region, and bubbles can be extruded from the inside of the filling glue, thus improving the packaging effect of the electronic device.

(2) The packaging method provided by at least one embodiment of the present disclosure is simple and easy to operate, and involves low costs.

The following points should be noted:

(1) The accompanying drawings in the embodiments of the present disclosure only involve structures relevant to the embodiments of the present disclosure, and other structures may refer to the common design.

(2) For the sake of clarity, in the drawings used to describe embodiments of the present invention, the thickness of layers or regions is enlarged or reduced, i.e., these drawings are not drawn to actual scale. It will be understood that when an element such as a layer, film, region or substrate is referred to as being "on" or "under" another element, the element may be "directly" "on" or "under" the other element, or intervening elements may be present.

(3) The features in the same embodiment or different embodiments of the present disclosure can be mutually combined without conflict.

The foregoing is only the embodiments of the present disclosure and not intended to limit the scope of protection of the present disclosure, and the protection scope of the present disclosure should be based on the protection scope of the appended claims.

What is claimed is:

1. A packaging method, comprising:
   providing a first substrate and a second substrate; and
   cell-assembling the first substrate and the second substrate to sandwich a filling glue between the first substrate and the second substrate to form a packaging structure, wherein
   the filling glue is mixed with electrophoretic liquid encapsulated by a capsule, and the electrophoretic liquid comprises an electrophoretic particle; and
   applying an electric field to control the electrophoretic particle to move directionally to deform the capsule and further to squeeze the filling glue surrounding the capsule in a process of cell-assembling the first substrate and the second substrate so that an air bubble in the capsule and in the filling glue is extruded from the capsule and the filling glue, respectively.

2. The packaging method according to claim 1, wherein the electrophoretic liquid is electrophoretic suspension liquid or an electrophoretic colloid solution.

3. The packaging method according to claim 1, wherein the electrophoretic particle comprises one selected from the group consisting of a positively charged inorganic particle, a positively charged organic particle, a negatively charged inorganic particle, and a negatively charged organic particle.

4. The packaging method according to claim 2, wherein the electrophoretic liquid further comprises a dispersion medium, a charge control agent and a stabilizer.

5. The packaging method according to claim 4, wherein a material of the dispersion medium comprises at least one selected from the group consisting of octane, heptane, toluene, ethylbenzene, o-xylene, n-butanol, carbon tetrachloride, tetrachloroethylene, styrene, (methyl) methacrylate, ethyl methacrylate, butyl methacrylate, divinylbenzene, diethylene glycol diacrylate, butylene glycol diacrylate, 1,6-hexanediol diacrylate, dipropylene glycol diacrylate, tripropylene glycol diacrylate, trimethylolpropane triacrylate, pentaerythritol tetraacrylate, dipentaerythritol pentaacrylate, and dipentaerythritol hexaacrylate.

6. The packaging method according to claim 4, wherein the charge control agent comprises at least one selected from the group consisting of organic sulfate, organic amide, and organic phosphate.

7. The packaging method according to claim 4, wherein the stabilizer comprises at least one selected from the group consisting of polyoxyethylene, alkyl dimethylamine oxide, sodium dodecyl benzene sulfonate, and propyl trimethoxy hydrochloride.

8. The packaging method according to claim 1, wherein a material of the capsule comprises at least one selected from the group consisting of urea formaldehyde resin, polyaniline, and melamine resin.

9. The packaging method according to claim 1, further comprising:
forming a closed cofferdam glue on the first substrate; and
applying the filling glue in a filling region formed by the cofferdam glue.

10. The packaging method according to claim 9, further comprising:
performing a curing treatment to the filling glue.

11. The packaging method according to claim 10, wherein performing a curing treatment to the filling glue comprises:
performing a heating treatment or an ultraviolet irradiation treatment to the filling glue.

12. The packaging method according to claim 1, wherein the process of cell-assembling the first substrate and the second substrate comprises:
providing a first pressing platform, and placing the first substrate on the first pressing platform;
providing a second pressing platform, and fixing the second substrate on the second pressing platform, the first pressing platform and the second pressing platform being arranged opposite to each other;
providing at least one electric field control element configured to apply the electric field during cell-assembling to control the electrophoretic particle to move directionally to deform the capsule; and
controlling the second pressing platform on which the second substrate is fixed to press downward toward the first pressing platform on which the first substrate is placed.

13. The packaging method according to claim 12, wherein the at least one electric field control element is located on a side of the first pressing platform on which the first substrate is not placed.

14. The packaging method according to claim 12, wherein the at least one electric field control element is located on at least one of a left side and a right side of the first substrate and the second substrate.

15. The packaging method according to claim 13, wherein a direction in which the electric field is applied is parallel to a plate surface of the first substrate and the second substrate.

16. A packaging apparatus, comprising:
a glue applying component, configured to form a filling glue on a first substrate or a second substrate, the filling glue being mixed with electrophoretic liquid encapsulated by a capsule, and the electrophoretic liquid comprising an electrophoretic particle;
a cell-assembling component configured to cell-assemble the first substrate and the second substrate; and
an electric field control element configured to apply an electric field to control the electrophoretic particle to move directionally to deform the capsule and further to squeeze the filling glue surrounding the capsule in a cell-assembling process of the first substrate and the second substrate so that an air bubble in the capsule and in the filling glue is extruded from the capsule and the filling glue, respectively.

17. The packaging method according to claim 2, wherein the electrophoretic particle comprises one selected from the group consisting of a positively charged inorganic particle, a positively charged organic particle, a negatively charged inorganic particle, and a negatively charged organic particle.

18. The packaging method according to claim 14, wherein a direction in which the electric field is applied is parallel to a plane surface of the first substrate and the second substrate.

19. A packaging method, comprising:
providing a first substrate and a second substrate; and
cell-assembling the first substrate and the second substrate to sandwich a filling glue between the first substrate and the second substrate to form a packaging structure, wherein
the filling glue is mixed with electrophoretic liquid encapsulated by a capsule, and the electrophoretic liquid comprises an electrophoretic particle; and
applying an electric field to control the electrophoretic particle to move directionally to deform the capsule in a process of cell-assembling the first substrate and the second substrate so that an air bubble in the capsule is extruded from the capsule,
wherein the process of cell-assembling the first substrate and the second substrate comprises:
providing a first pressing platform, and placing the first substrate on the first pressing platform;
providing a second pressing platform, and fixing the second substrate on the second pressing platform, the first pressing platform and the second pressing platform being arranged opposite to each other;
providing at least one electric field control element configured to apply the electric field during cell-assembling to control the electrophoretic particle to move directionally to deform the capsule; and
controlling the second pressing platform on which the second substrate is fixed to press downward toward the first pressing platform on which the first substrate is placed.

* * * * *